United States Patent [19]
Sato et al.

[11] Patent Number: 5,859,776
[45] Date of Patent: Jan. 12, 1999

[54] METHOD AND APPARATUS FOR THE DESIGN OF A CIRCUIT

[75] Inventors: Kenichi Sato; Norihisa Shirota, both of Kanagawa; Yasuhiro Iida, Tokyo; Mitsuru Sasano, Kanagawa, all of Japan

[73] Assignee: Sony Corporation, Tokyo, Japan

[21] Appl. No.: 695,926

[22] Filed: Aug. 12, 1996

[30] Foreign Application Priority Data

Aug. 18, 1995 [JP] Japan .................................. 7-233526

[51] Int. Cl.$^6$ .................................................. G06F 19/00
[52] U.S. Cl. ................................ 364/468.28; 364/490
[58] Field of Search .......................... 364/468.28, 488, 364/489, 490, 491, 468.24

[56] References Cited

U.S. PATENT DOCUMENTS

| 5,410,491 | 4/1995 | Minami | 364/491 |
|---|---|---|---|
| 5,416,718 | 5/1995 | Yamazaki | 364/488 |
| 5,557,531 | 9/1996 | Rostoker et al. | 364/489 |
| 5,618,744 | 4/1997 | Suzuki et al. | 438/599 |
| 5,638,291 | 6/1997 | Li et al. | 364/490 |
| 5,638,294 | 6/1997 | Sasada | 364/491 |
| 5,663,889 | 9/1997 | Wakita | 364/490 |
| 5,693,540 | 12/1997 | Turner et al. | 437/7 |

*Primary Examiner*—Paul P. Gordon
*Attorney, Agent, or Firm*—Limbach & Limbach L.L.P.

[57] ABSTRACT

In automated design, a useful insertion of a delay buffer or an increase in the delay time of the critical path could not been prevented. When inserting a logic element between two certain points on the circuit, substitution of other paths passing through the relevant insertion position is considered and the insertion position of the logic element is determined finally.

20 Claims, 9 Drawing Sheets

METHOD AND APPARATUS FOR THE DESIGN OF A CIRCUIT

BACKGROUND OF THE IVENTION

1. Field of the Invention

This invention relates to a design method used for a logical design of a semiconductor integrated circuit and to a design apparatus using this methods

2. Description of the Related Art

Generally, in a storage element for taking in an input signal at a changing point of a synchronous signal (hereinafter referred to as "clock" and holding a value of signal (hereinafter referred to as "flip-flop"), there is a possibility that a misoperation takes place when an input signal changes in a period before and after the changing point. Accordingly, in the flip-flop, the period for forbidding a change in input signal is defined for a period before and after the clock changing point as shown in FIG. 1. A period immediately before the clock changing point is called setup time and a period immediately after the clock changing point is called hold time.

Here, the circuit of FIG. 2 is taken as an example, and the case of data transfer between two storage elements will be considered. In FIGS. 2, the registers R0 and R1 represent D flip-flops, respectively. Hereinafter, the registers are represented as flip-flops. In addition, symbols D, CK and Q denote a data input pin, a clock input pin and a data output pin of the D flip-flop, respectively. Furthermore, symbol "Tpd" denotes the time taken from the input of data inputted to the data input pin of the register R0 after a change of the clock CK until the output to the data output pin Q after held in the flip-flop R0. And, symbol "Tdata" denotes the time taken after the data output pin Q of the flip-flop R0 underwent to a predetermined operation until data reaches the data input pin D of the flip-flop R1.

Meanwhile, to hold a correct value on the side of the flip-flop R1 so as to change at the same timing, all clocks under an ideal working environment must satisfy the following equation:

$$Tpd+Tdata>Thold \qquad (1)$$

However, on an actual clock network, there is a delay originating from the influence of wiring or buffering and the length of delay differs with the respective flip-flops, so that the difference occurs in the arrival time of individual clocks. This occurrence is called "clock skew".

In FIG. 2, the clock skews of the flip-flop R0 and flip-flop R1 are designated as a symbol of triangle (delay). This time is denoted by "Tck".

On consideration of this clock skew, the above equation (1) can be rewritten as the following equation:

$$Tpd+Tdata>Thold+Tck \qquad (2)$$

This equation (2) represents that the hold time "Thold" of data have to be taken longer for the clock skew when there is a clock skew.

In this way, the equation (2) must be satisfied in order that data are transferred correctly between flip-flops. For this, these are several "clock skew countermeasures".

First of all, one is to reduce the hold time "Thold", another is to increase "Tpd", and another is to reduce "Tck", the other is to increase "Tdata".

Here, the first and second countermeasures, i.e., the countermeasures to reduce the hold time "Thold" and to increase the "Tpd", are characteristics intrinsic to a flip-flop and it is difficult for a designer to control them. However, if several flip-flops different in these characteristics are provided on the side of a semiconductor designer, for example, the circuit designer can approximately control these characteristics by selection of those flip-flops.

With the third countermeasure, i.e., one to reduce the clock skew, the greater the number of flip-flops is, the more difficult becomes the equal distribution of all flip-flops. As one means to achieve the third countermeasure, there is a method of self-loop connection by using a flip-flop of multi-bit configuration. However, since the bit configuration of a multi-bit flip-flop is limited in kind, selection of the most suitable combination, which group of flip-flops is allotted to the multi-bit flip-flop, is generally difficult.

The fourth countermeasure is to increase the length of delay without change in the logic between any pair of flip-flops The most simple countermeasure is achieved by inserting a non-inversional buffer. Generally, this method is often used because of being executable easier than other methods.

However, with a method or inserting a buffer between the flip-flops like the fourth countermeasure, the insertion position may becomes an issue, An effective insertion position will be thought over using a circuit example of FIGS. 3A to 3C. Here, FIG. 3A is the original circuit diagram before the insertion of a delay buffer, where the outputs of the flip-flops R0 and R1 are individually connected through the logic element U0 to the input of a flip-flop R2.

Here, because of a small delay in the logic element U0, it is assumed that a hold time violation to input from any of the flip-flops R0 and R1 takes place in the flip-flop R2.

In this case, there are two methods for inserting a delay-compensating buffer to assure the hold time.

One is a method for inserting delay buffers directly after the outputs of the flip-flops R0 and R1 as shown in FIG. 3B. This enables the hold time of both paths to be assured. At this time, two buffers are needed.

The other is a method for inserting a delay buffer directly before the input of the flip-flop R2 as shown in FIG. 3C. This method also enables the hold time of both paths to be assured, and one buffer is enough.

From a consideration of this result alone, it may be regarded as advisable to insert a delay buffer directly before a flip-flop, but such a connection is not always good. In the circuit example of FIGS. 4A to 4C, it is rather effective to insert a delay buffer directly after the output of the flip-flop R0. That is, FIG. 4A is the original circuit diagram before the insertion of the delay buffer, and the output of the flip-flop R0 is connected to the individual input of the flip-flop R1 and the flip-flop R2 FIG. 4B is the circuit diagram with a delay buffer inserted directly before the individual input of the flip-flop R1 and flip-flop R2 in order to assure the hold time. FIG. 4C is the circuit diagram with a delay buffer inserted directly after the output of the flip-flop R0. That is, when compensating the hold time by insertion of a delay buffer, there are several insertion positions to obtain the same effect and the number of required buffers differs depending on the position of insertion.

In an actual design, since the problems mentioned in the above examples arise in combination, it is generally difficult to find the most appropriate positions of insertion by manual operation.

By using the circuit example of FIGS. 5A to 5C, for example, it will be thought over which influence is exerted upon other paths by inserting a delay buffer into a certain path. FIG. 5A shows the original circuit before the insertion of a delay buffer.

Here, after passing through the partial circuit designated with hatched lines in FIG. 5A, the output from the flip-flop R0 is connected to the input of the flip-flop R2 via a logic element U0. Incidentally, the length of delay in this partial circuit is assumed to be large enough to satisfy the hold time. In addition, the output of the flip-flop R1 is connected to the input of the flip-flop R2 via only the logic element U0 alone.

In this example, it is assumed that a hold time violation to input from the flip-flop R1 takes place in the flip-flop R2.

Here, to assure the hold time, it will be considered to insert a delay buffer for the delay-compensation.

First, as shown in FIG. 5B, the case of inserting a buffer directly before the flip-flop R2 will be considered.

Such a connection assures the hold time required for transmission of data from the flip-flop R1 to the flip-flop R2, however at the same time it also lengthens the delay time in the path leading from the flip-flop R0 through the partial circuit designated with hatched lines and the logic element U0 to the flip-flop R2.

If this path is a critical path (i.e., the longest-delay path in the circuit), the possibility of setup time violation comes to appear by contrary. The increase in the delay time of the critical path is a serious problem, because of signifying a decrease in the operating speed of the circuit.

With this example, as shown in FIG. 5C, it becomes the mast desirable connection to insert directly after the flip-flop R1, Furthermore, in the example shown in FIG. 6, there is a path branching from the output of the flip-flop R1, passing through a sufficiently delayed partial circuit and reaching the flip-flop R3, in addition to the example of FIGS. 5A to 5C.

Accordingly, insertion of a delay buffer directly after the output of the flip-flop R1 leads to an increase in the delay of the path from the flip-flop R1 to the flip-flop R3.

Thus, with this circuit, the most desirable position of insertion is existed between a branch J0 and the logic circuit U0.

As mentioned above, it is very difficult to decide the insertion point of a delay buffer to be inserted for the compensation of a hold time violation. At present this operation relies on manpower, but in recent years it has become impossible with a rapid increase in the scale of circuit.

SUMMARY OF THE INVENTION

In view of the foregoing, an object of this invention is to provide a method and an apparatus for the design of a circuit in which an insertion point is automatically determined so that delay buffers can be inserted without waste and the delay time of the critical path can not be increased The foregoing object and other objects of the intention have been achieved by the provision of a method for the design of a circuit for the logic design, which comprises the steps of: receiving first information concerning a circuit to be designed; receiving second information concerning paths on the circuit; determining an insertion position where a logic element is inserted between certain two points on the circuit on the basis of the first and second information. The determining step determines the insertion position with taking a delay of other paths through the position for inserting the logic element into consideration.

Further, an apparatus for the design of a circuit comprises: means for receiving first information concerning a circuit to be designed; means for receiving second information concerning paths on the circuit; means for determining a insertion position where a logic element is inserted between certain two points on the circuit on the basis of the first and second information. The determining means determines the insertion position with taking a delay of other paths through the position for inserting the logic element into consideration.

The nature, principle and utility of the invention will become more apparent from the following detailed description when read in conjunction with the accompanying drawings in which like parts are designated by like reference numerals or characters.

BRIEF DESCRIPTION OF THE DRAWINGS

Preferred embodiments of this invention will be described with reference to the accompanying drawings.

DETAILED DESCRIPTION OF THE INVENTION

Figure 7:
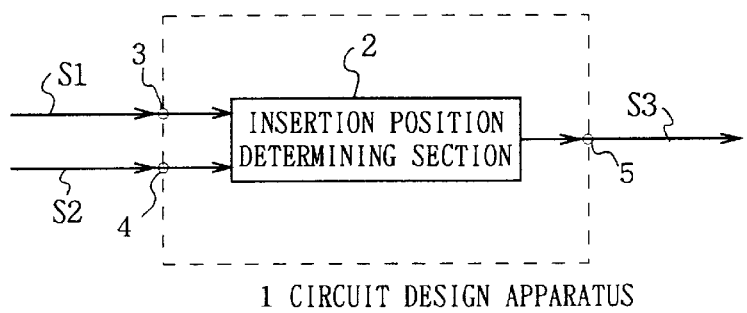
FIG. 7 is a block diagram showing one embodiment of a circuit design apparatus according to the present invention.

Preferred embodiments of this invention will be described with reference to the accompanying drawings:

FIG. 7 shows the entire configuration of a circuit design apparatus This circuit design apparatus 1 inputs an item of information concerning the paths of hold time violation and a circuit description expressed in terms of characters from a recording medium and determines the insertion position of a delay buffer for the compensation of a hold time violation on the basis of these items of information.

However, a clock used in the circuit to be designed is assumed to be of single phase. In addition, storage elements contained in the circuit to be designed is assumed to be only flip-flops of one-bit configuration alone For further simplification, only one type of non-inversional buffers shall be used as delay buffers to be inserted.

Meanwhile, in this circuit design apparatus 1, hold time violation path information S1 comprising a list of paths with hold time violation occurring and a circuit description S2 expressed in terms of characters are supplied to input terminals 3 and 4 respectively. And the hold time violation path information S1 and the circuit description S2 supplied to the input terminals 3 and 4 respectively are supplied to an insertion position determining section 2 in order to decide an insertion position of a delay buffer for the compensation of the hold time on the basis of these list or violation path and circuit description. Incidentally, the result or processing is output from the insertion position determining section 2 through an output terminal 5 as buffer insertion position information S3.

Figure 8:
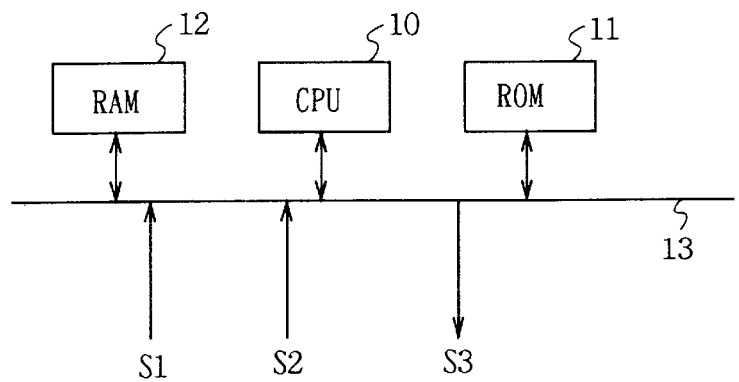
FIG. 8 is a block diagram showing one embodiment of a insertion position determining section according to the present invention.

As shown in FIG. 8 the insertion position determining section 2 is composed of a CPU 10 for executing an insertion position determining procedure detailed later, a ROM 11 for storing a program for the procedure, a RAM 12 for temporarily storing the input hold time violation path information S1 and the input circuit description, and a bus 13 to which the CPU 10, the ROM 11, and the RAM 12 are connected respectively.

Then, a format of information, such as hold time violation path information S1 and buffer insertion position information S3, dealt with by the circuit design apparatus 1, will be shown. Incidentally, the format of information shown here is only one example and can assume another format to make the storage capacity and processing time efficient.

Figure 9:
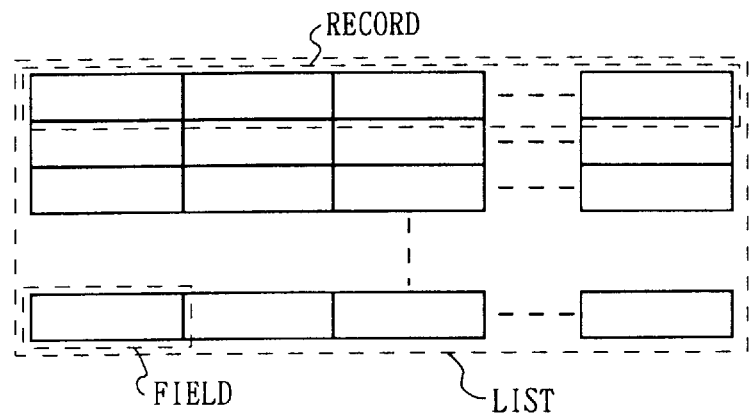
FIG. 9 is a chart explaining format to be dealt with by the circuit design apparatus.

Hereinafter, words concerning the format of information are defined as shown in FIG. 9. First, the field shall signify a region for storing an item of information and the record shall signify a set of such fields as elements. In addition, the list shall signify a set of records as elements.

Furthermore, the designation, "N (name of a set)" shall be employed to represent the number of elements in a set and "name of a set (n)" shall be employed to refer to the n-th element of the set.

In addition, "name of the record, name of a field" shall be employed to refer to a field in the record.

Figure 10:
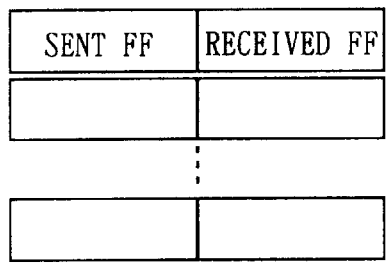
FIG. 10 is a chart showing the format of hold time violation path information.

First, the format of hold time violation path information S1 will be shown in FIG. 10. This hold time violation path information is represented by the names of two flip-flops located at both ends of the path in which a hold time violation takes place. As shown in FIG. 10, a record of this "hold time violation path information" comprises a "sent FF" and a "received FF".

Figure 11:
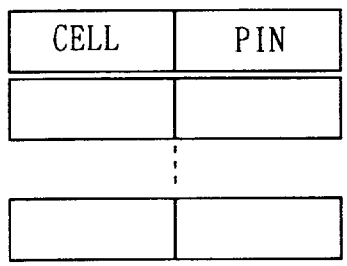
FIG. 11 is a chart showing the format of buffer insertion position result.

Next, the format of the result of buffer positions will be shown in FIG. 11. The result of buffer insertion positions is a list for indicating the positions of inserting delay buffers. As shown in FIG. 11, this "result of buffer insertion positions" record comprises two records of "cell" field and "pin" field. It is represented by the format in which "pin" of which "cell" in the circuit a buffer should be inserted.

Figure 12:
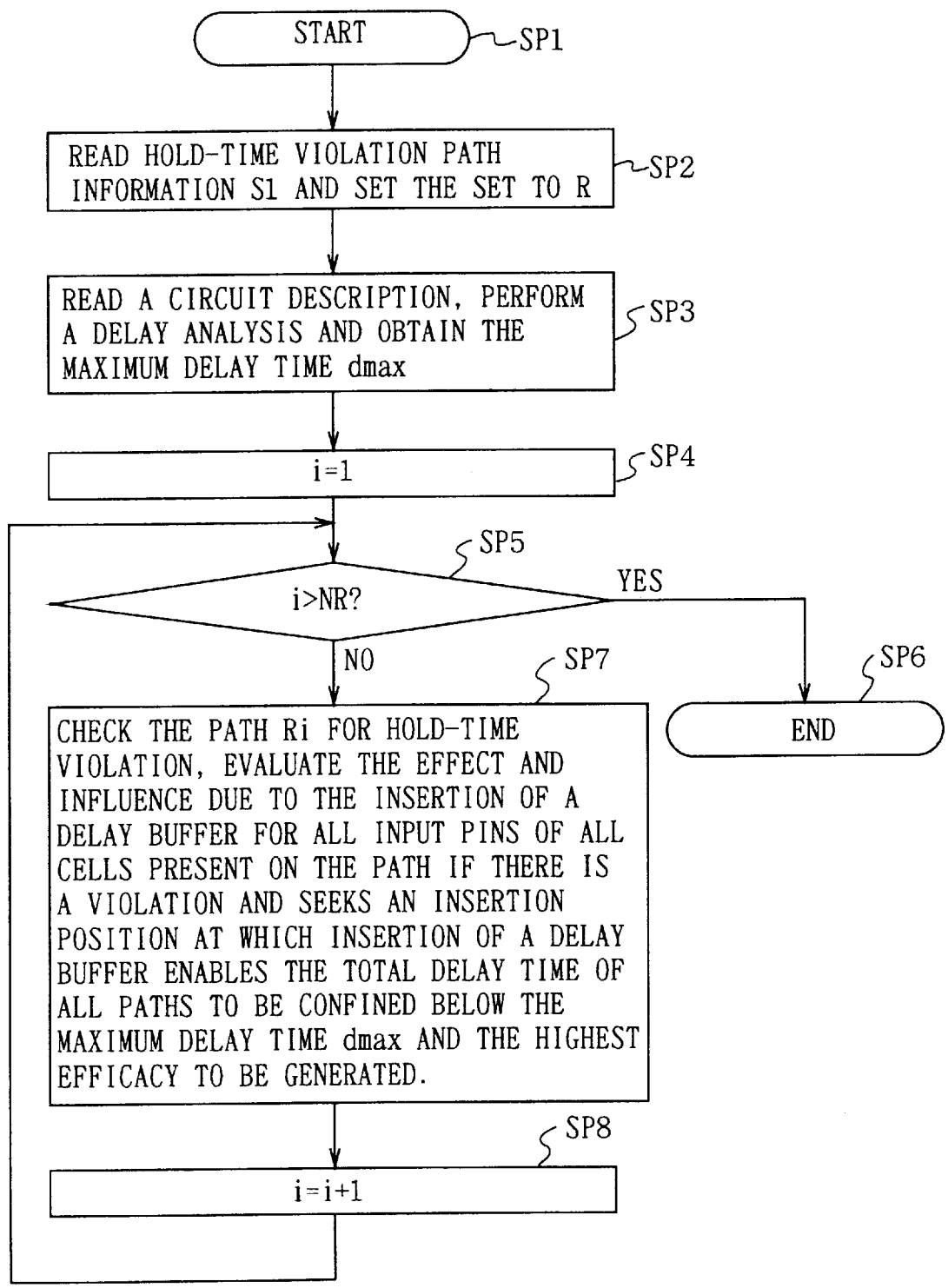
FIG. 12 is a flowchart showing the outline of the insertion position determining procedure of a delay buffer.

FIG. 12 shows an insertion position determining procedure by the insertion position determining section 2.

First, the circuit design apparatus 1 reads hold time violation path information S1 in the insertion position determining section 2 and stores the set as R, at step SP2.

Then, proceeding to step SP3, the apparatus reads a circuit description S2 expressed in terms of characters, analyzes the length of delay in each path and obtains the maximum delay time dmax.

At the next step SP4, the apparatus sets the parameter i to "1" and at the subsequent step SP5, judges whether the parameter i is larger than the number of elements NR regarding hold time violation.

In this connection, when an affirmative result is obtained, the insertion position determining section 2 proceeds to step SP6, outputs the "buffer insertion position result" record generated for all paths and finishes the insertion position determining process.

On the contrary, when a negative result is obtained, the insertion position determining section 2 proceeds to step SP7.

Here, the insertion position determining section 2 confirms the presence of hold time violation for each path Ri corresponding to the parameter i, evaluates the effect and influence due to the insertion of a delay buffer on all input pins of all cells present on the path if there is a violation and seeks the most efficient position for improvement in hold time violation.

Incidentally, after the efficient insertion point of a delay buffer is identified by these processing, the insertion position determining section 2 makes out a "buffer insertion position result" record on the basis of these items of information.

After the completion of this processing, the insertion position determining section 2 proceeds to step SP8, updates a value of parameter i, returns to the judgment processing of step SP5, and repeats a loop of steps SP5-SP7-SP8-SP5 until the making-out processing for all paths of hold time violation is completed.

Figure 13:
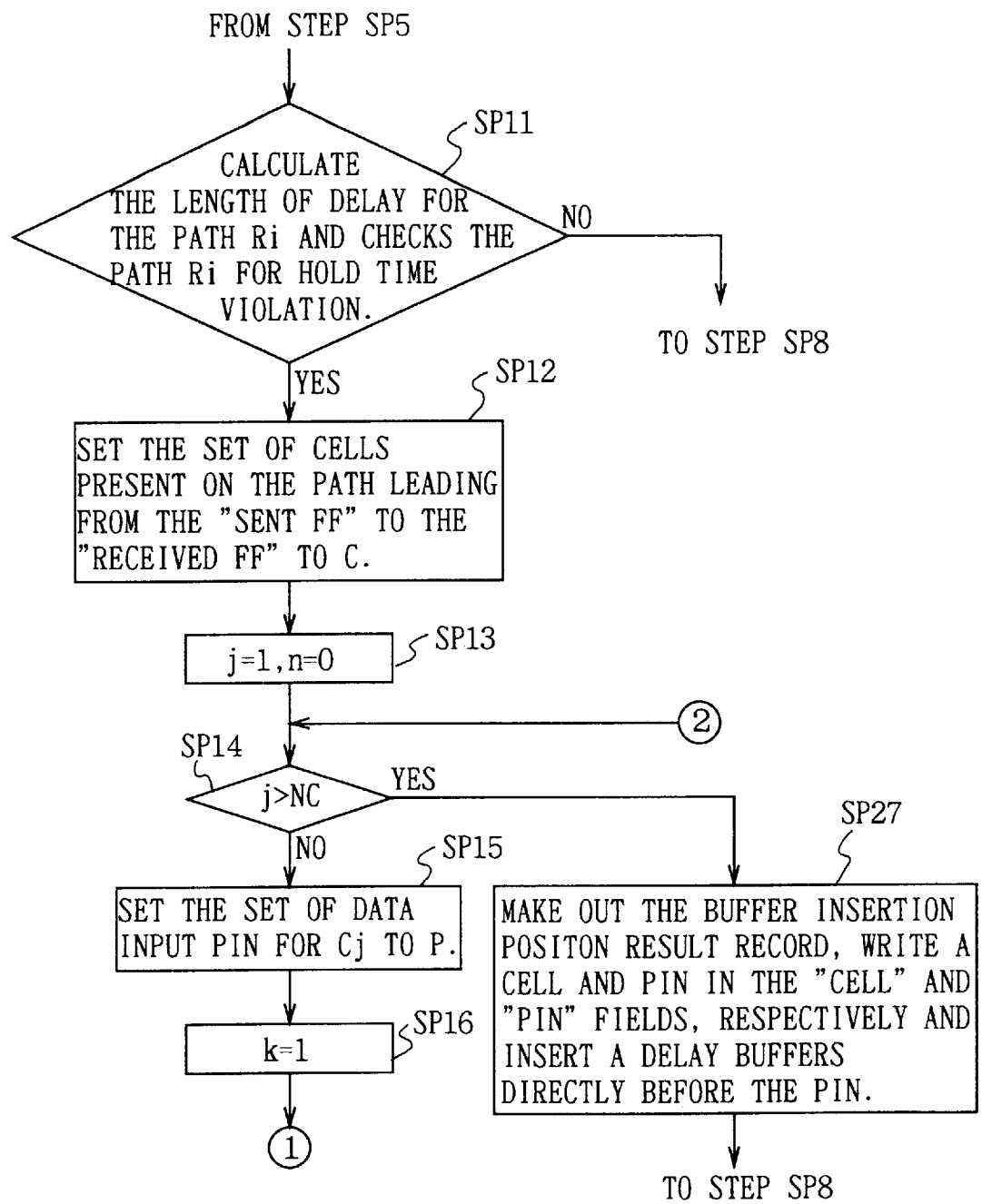
FIG. 13 and 14 are more detailed flowcharts explaining specified steps.
Figure 14:
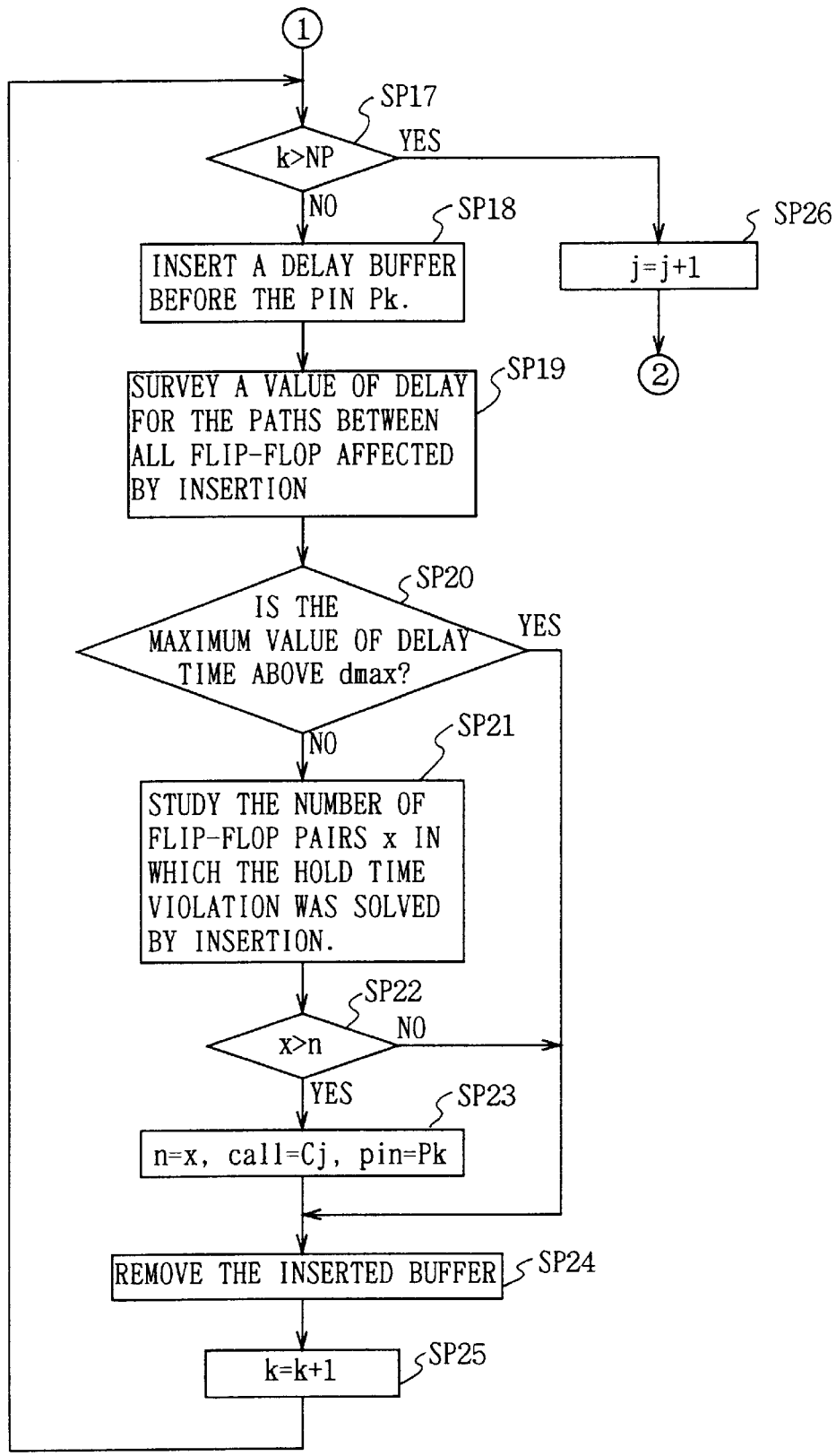

FIGS. 13 and 14 show a concrete procedure of step SP7.

First, on proceeding from step SP5 to step SP7, the insertion position determining section 2 enters step SP11, calculates the length of delay for the path Ri to check the path Ri for hold time violation.

Here, obtaining a negative result if there being no hold time violation on the path is judged, the insertion position determining section 2 proceeds to step SP8 without effecting any processing.

On the other hand, obtaining an affirmative result if it is judged that there is a hold time violation on the path, the insertion position determining section 2 proceeds to step SP12 and finds the set C of cells present on the path leading from the "sent FF" field in the "hold time violation path information (Ri)" record to the "received FF" field in the "hold time violation path information (Ri)" record.

Thereafter, proceeding to step SP13 and substituting 1 and 0 into the parameters j and n, respectively, the insertion position determining section 2 proceeds to step SP14.

Here, the parameter j represents the number of processing by the iterative processing routine given at step SP14 to step SP26 and specifically corresponds to the serial number of each cell belonging to the set C.

At step SP14, it is judged whether a value of parameter j is larger than the number of elements NC or not.

Here, if an affirmative result is obtained, the insertion position determining section 2 understands the determining procedure of insertion position for all cells present on the path R1 is completed by the processing of step SP15 to step SP26 described later, proceeds to step SP27 and is arranged to make out the buffer insertion position result record.

Incidentally, at this step SP27, the insertion position determining section 2 makes out the "buffer insertion position result" record and writes a cell and a pin in the "cell" and "pin" fields, respectively. Thereafter, inserting a delay buffer directly before the pin that is judged to be suitable for their insertion position, the insertion position determining section 2 proceeds to the step SP8 mentioned above.

In contrast to this, if a negative result is obtained at step SP14, the insertion position determining section 2 proceeds to step SP15 and finds the set P of input pins corresponding to the cell Cj identified by the parameter j.

In this manner, when the set P of input pins is found for the cell Cj, the insertion position determining section 2 proceeds to step SP16, sets a value of parameter k to 1 and at the next step SP17, turns to processing of judging whether a value of parameter k is larger than the number NP of input pins found above or not. Here, the parameter k represents the number of repetition in the iterative processing routine given at step SP17 to step SP25 and concretely corresponds to the serial number of an input pin.

Here, when an affirmative result is obtained at step SP17 and examination of the insertion point for all input pins corresponding to the cell Cj is completed, the insertion position determining section 2 proceeds to step SP26 and turns object to be processed to the next cell Cj+1.

Incidentally, after the completion of processing at this step SP26, the insertion position determining section 2 returns to step SP14.

On the other hand, when an affirmative result is obtained at step SP17, the insertion position determining section 2 proceeds to the processing of step SP18 to step SP25 constituting an iterative processing routine.

First, inserting a delay buffer directly before the k-th input pin Pk at step SP18, the insertion position determining section 2 acts to survey a value of delay for all paths between the flip-flops affected by the relevant delay buffer at the next step SP19.

After survey at the previous step SP19 is completed for all paths, the insertion position determining section 2 judges whether the maximum value of delay time obtained for all these paths is above the maximum delay time dmax previously evaluated for the circuit or not at step SP20.

Here, if an affirmative result is obtained, since insertion of this delay buffer generates a new critical pulse, the insertion position determining section 2 turns to the processing of step SP24 without storing the information concerning this and acts so as to remove the inserted buffer.

In contrast to this, if a negative result is obtained at step SP20, the insertion position determining section 2 proceeds to step SP21, studies the number x of flip-flop pairs in which the hold time violation was solved by insertion and at the next step SP22 judges whether this number x is larger than the parameter n (representing the maximum value of the number of flip-flop pairs in which the hold time violation was solved by the processing routine executed prior to this step) or not.

Here, if a negative result is obtained, that is, if the flip-flops in which the hold time violation was solved are not improved as compared with the previous processing, the insertion position determining section 2 decides that the insertion of such a delay buffer is a useless insertion and proceeds to the processing of step SP24. And it acts so as to remove the inserted buffer.

In contrast to this, if an affirmative result is obtained, that is, if the number x of flip-flop pairs in which the hold time violation was solved by insertion is above that obtained at the previous processing, at step SP23 the insertion position determining section 2 inserts the value x obtained at this time into the parameter n and substitutes the cell Cj of this time to cell of the "cell" field. Furthermore, it writes the pin No. Pk into which a delay buffer was inserted at this time in pin of the "pin" field.

Then, the insertion position determining section 2 proceeds to step SP25 and acts so as to turn the processing to the next pin No. k+1.

The above-mentioned is the content of processing to be executed in individual processing steps and processing routines.

According to the above arrangement, the iterative processing routine of steps SP5-SP7-SP8-SP5 enables one to examine directly before input pin in which cell present on each path a delay buffer is inserted the most efficiently in eliminating the hold time violation for all paths in which a hold time violation takes place and allowing a "buffer insertion position result" to be made up by this examination result leads to the implementation of a delay-element insertion determining method and circuit design apparatus enabling an appropriate circuit design even for a great-scale circuit.

Incidentally, the provision of a processing step (step SP20) for the insertion position determining section 2 of the circuit design apparatus 1 to anew evaluate the extent of delay time at insertion for all paths affected by insertion in determining a buffer insertion position and to check that the maximum value is below the maximum delay time dmax of the original circuit so as to exclude the insertion position of maximum delay time exceeding dmax from the objects of delay buffer insertion position, enables an increase in the delay time of the critical path also to be effectively eluded which has so far been unsolved.

In addition, in the case of inserting a delay buffer directly before the input pin of a certain cell present on the path, the provision of a processing step (step SP22) to study which input pin is the most effective for solving the hold time violation for each cell and fix the most effective input pin as the insertion position of a delay buffer enables a useful insertion of a delay buffer to be eliminated which has so far been unsolved.

Incidentally, in the aforementioned embodiments, it has been described in the case of inserting only one type of delay buffer into each path, however, the present invention is not limited to the case but is applicable to the case of inserting plural types of delay buffers.

In addition, in the aforementioned embodiments, it has been described in the case of inserting a non-inversional buffer as a delay buffer, however, the present invention is not limited to the case but is applicable to the case of other types of delay buffers.

Further, in the aforementioned embodiments, it has been described in the case of inserting one non-inversional buffer as a delay buffer, however, the present invention is not limited to the case but is applicable to the case of inserting even numbers of inversional buffers.

Furthermore, in the aforementioned embodiments, it has been described in the case of the circuit to be processed comprising only flip-flops, however, the present invention is not limited to the case but is applicable also to a circuit including other storage elements than flip-flops.

In addition, in the aforementioned embodiments, it has been described in the case of the circuit to be processed comprising only 1-bit configuration flip-flops, however, the present invention is not limited to the case but is widely applicable to a circuit including multi-bit configuration flip-flops.

Furthermore, in the aforementioned embodiments, it has been described in the case of a synchronous signal being of single phase, however, the present invention is not limited to the case but is easily applicable to the case of a synchronous signal being of multi-phase.

In addition, in the aforementioned embodiments, it has been described an arrangement to output the insertion position determined by the insertion position determining section 2 as circuit design apparatus 1, however, the present invention is not limited to the case but can allow a buffer actually inserted at the insertion position determined by the insertion position determining section 2 to function to rewrite the circuit.

Figure 1:
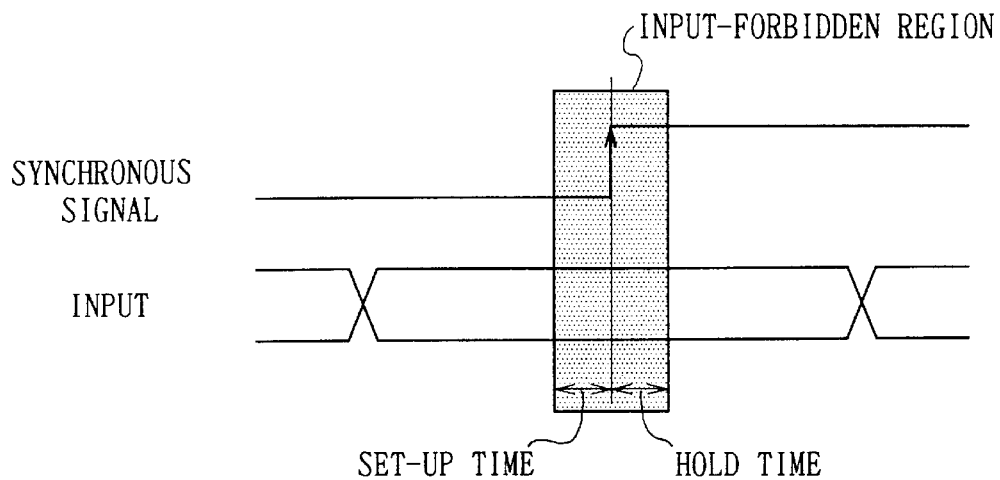
FIG. 1 is a signal waveform explaining the setup time and hold time in a D flip-flop.
Figure 2:
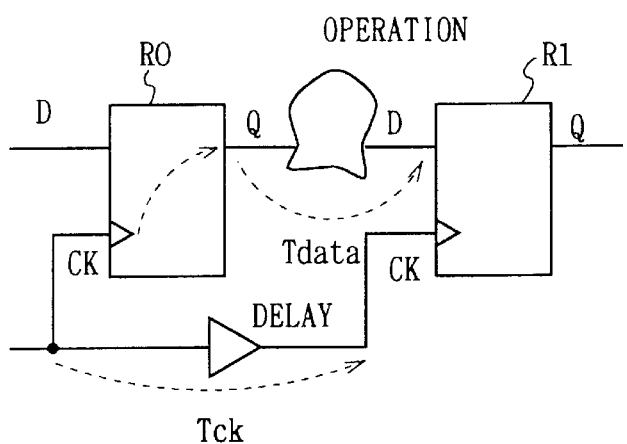
FIG. 2 is a block diagram explaining data transfer between flip-flops.
Figure 3A:
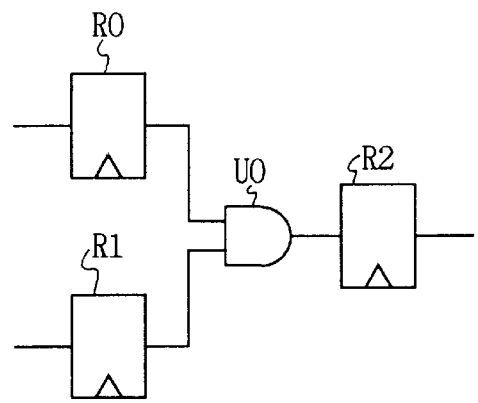
FIGS. 3A, 3B, and 3C and 4A, 4B, and 4C are block diagrams showing an effective insertion position of a delay buffer.
Figure 3B:
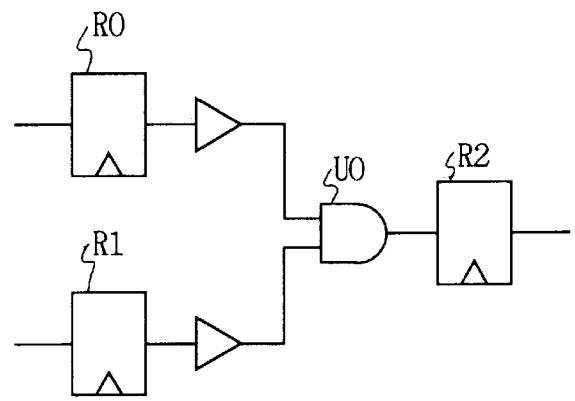
Figure 3C:
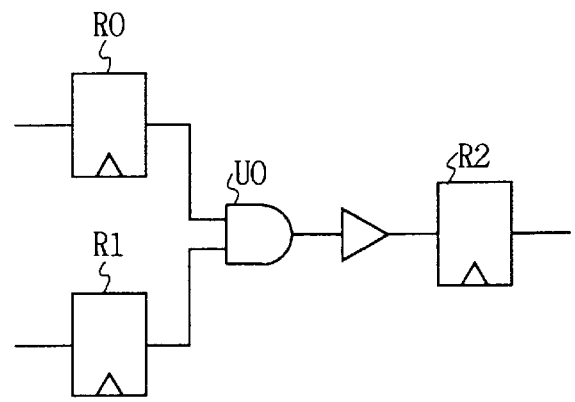
Figure 4A:
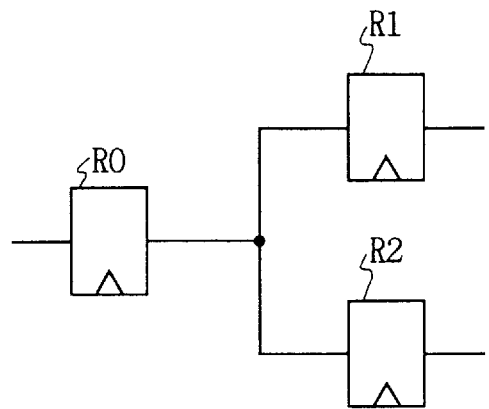
Figure 4B:
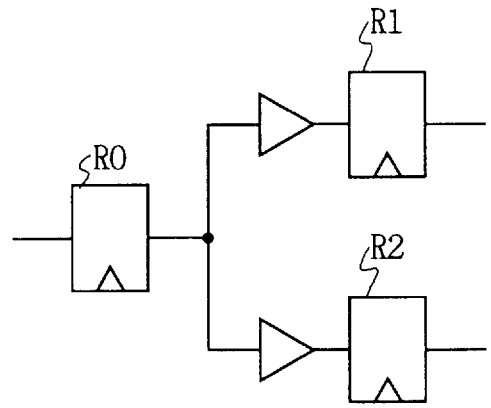
Figure 4C:
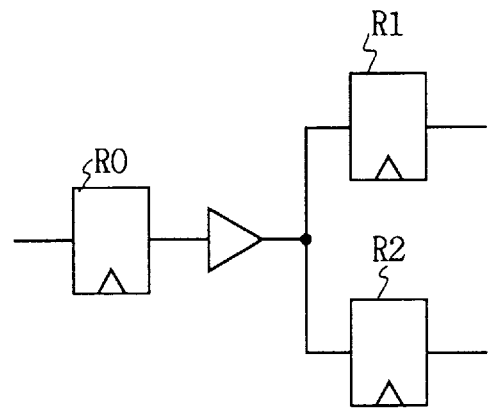
Figure 5A:
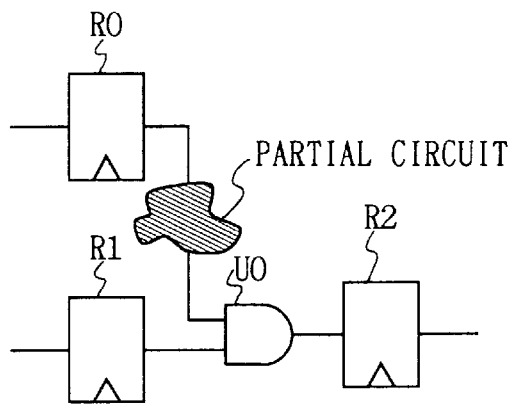
FIGS. 5A, 5B, and 5C and 6 are block diagrams explaining influence exerted on other paths by insertion of a delay buffer.
Figure 5B:
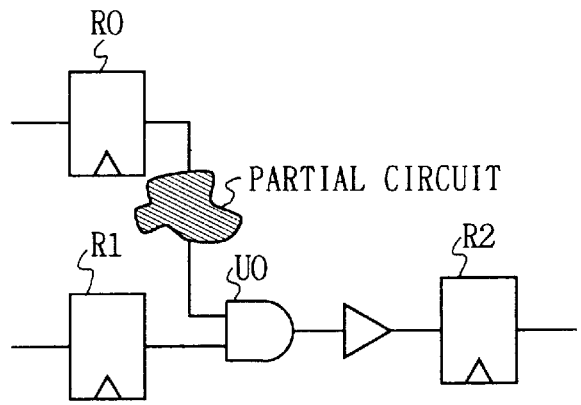
Figure 5C:
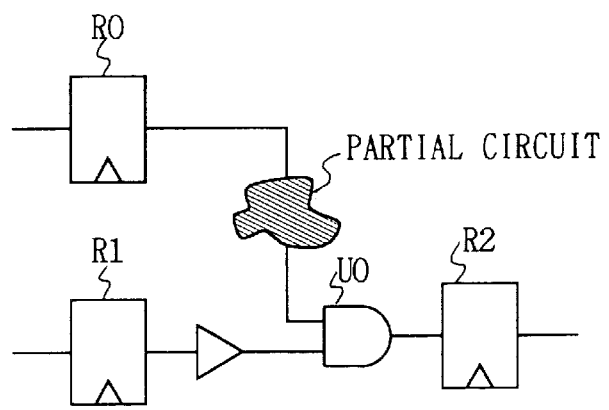
Figure 6:
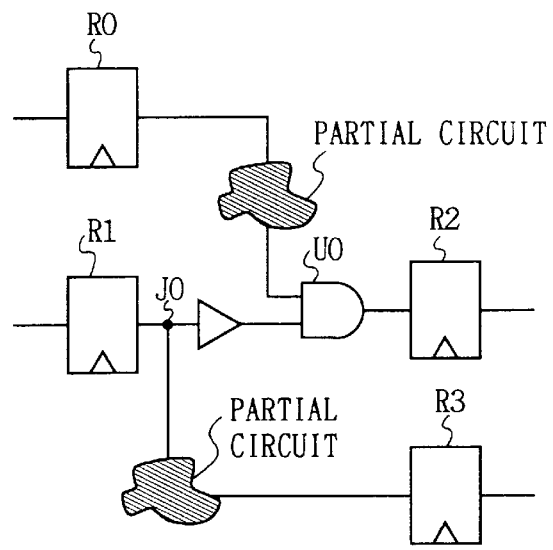

Furthermore, in the aforementioned embodiments, it has been described in the case of inserting a delay buffer directly before the input pin, however, the present invention is not limited to the case but is allowed to function to insert a delay buffer directly after the input pin, thereby enabling such a redundant insertion as shown in FIG. 3B to be eluded.

As described above, according to the present invention, when a logic element is inserted between two certain points on the circuit, by determining an insertion position of the above logic element under consideration of a delay of other paths passing through the relevant insertion position, the insertion position determining operation of a logic element can be automated which has so far required much time because of manual operation. Thus, the time taken for processing can be shortened.

While there has been described in conjunction with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A method for the design of a circuit for a logic design, comprising the steps of:

receiving circuit information concerning a circuit to be designed;

receiving hold time violation path information concerning paths on said circuit having a hold time greater than a predetermined time; and determining an insertion position where a logic element is inserted between certain two points on said circuit on the basis of said circuit information and said hold time violation path information, wherein said determining step determines said insertion position by taking into consideration a delay of other paths through the insertion position of said logic element.

2. The method for the design of a circuit according to claim 1, wherein other paths through said inserting position are paths between storage elements.

3. The method for the design of a circuit according to claim 1, wherein said logic element is an element whose output is logically not different from the input.

4. The method for the design of a circuit according to claim 3, wherein said logic element is a non-inversional buffer.

5. The method for the design of a circuit according to claim 3, wherein even numbers of inversional buffers are employed as said logic element.

6. The method for the design of a circuit according to claim 1, wherein said circuit is represented using characters.

7. The method for the design of a circuit according to claim 1, wherein said circuit is represented using drawings.

8. The method for the design of a circuit according to claim 1, wherein said circuit operates with a single-phase synchronous signal.

9. The method for the design of a circuit according to claim 1, wherein said circuit operates with a multi-phase synchronous signal.

10. An apparatus for the design of a circuit, comprising:

means for receiving circuit information concerning a circuit to be designed;

means for receiving hold time violation path information concerning paths on said circuit having a hold time greater than a predetermined time;

means for determining an insertion position where logic element is inserted between certain two points on said circuit on the basis of said circuit information and said hold time violation path information; and wherein said determining means determines said insertion position by taking into consideration a delay of other paths through the insertion position of said logic element.

11. The apparatus for the design of a circuit according to claim 10, wherein the other paths through said insertion point are paths between storage elements.

12. The apparatus for the design of a circuit according to claim 10, wherein said logic element is an element whose output is logically not different from the input.

13. The apparatus for the design of a circuit according to claim 10, wherein said logic element is a non-inversional buffer.

14. The apparatus for the design of a circuit according to claim 10, wherein even numbers of inversional buffers are employed as said logic element to be inserted.

15. The apparatus for the design of a circuit according to claim 13, wherein the information concerning said circuit is expressed in terms of characters.

16. The apparatus for the design of a circuit according to claim 13, wherein the information concerning said circuit is expressed in terms of drawings.

17. The apparatus for the design of a circuit according to claim 13, wherein said circuit operates with a single-phase synchronous signal.

18. The apparatus for the design of a circuit according to claim 13, wherein said circuit operates with a multi-phase synchronous signal.

19. A method for the design of a circuit for a logic design, comprising the steps of:

receiving circuit information from a circuit to be designed to determine a delay time in each path of said circuit;

summing the delay times of each path to determine a maximum delay time;

receiving hold time violation path information from a path in said circuit having a hold time greater than a predetermined time;

evaluating the effect of an insertion of a delay element for a plurality of input pins present on the path having a hold time greater than a predetermined time, wherein the circuit comprises a plurality of cells and each of the plurality of cells includes a plurality of input pins;

selecting a delay element insertion position before one of the plurality of input pins based on the circuit information and the hold time violation path information by taking into consideration a delay of other paths through the delay element insertion position such that the delay element insertion position selected is a most efficient delay element insertion position; and inserting the delay element into the delay element insertion position.

20. The method for the design of a circuit according to claim 1, wherein the step of evaluating the effect of an insertion of a delay element for a plurality of input pins present on the path having a hold time greater than a predetermined time, wherein the circuit comprises a plurality of cells and each of the plurality of cells includes a plurality of input pins comprises:

calculating the effect of an insertion of a delay input for all cells and all input pins present on the path having a hold time greater than a predetermined time.

* * * * *